(12) United States Patent
Han et al.

(10) Patent No.: US 11,391,765 B2
(45) Date of Patent: Jul. 19, 2022

(54) TEST SOCKET ASSEMBLY WITH WAVEGUIDE ANTENNA PROBE

(71) Applicant: XCERRA CORPORATION, Norwood, MA (US)

(72) Inventors: Dongmei Han, Shoreview, MN (US); Benoit Gubert, Castellet-lès-Sausses (FR); Yukang Feng, Maplewood, MN (US)

(73) Assignee: XCERRA CORPORATION, Norwood, MA (US)

( * ) Notice: Subject to any disclaimer, the term of this patent is extended or adjusted under 35 U.S.C. 154(b) by 28 days.

(21) Appl. No.: 16/778,677

(22) Filed: Jan. 31, 2020

(65) Prior Publication Data

US 2020/0256908 A1 Aug. 13, 2020

Related U.S. Application Data

(60) Provisional application No. 62/802,883, filed on Feb. 8, 2019.

(51) Int. Cl.
*G01R 29/08* (2006.01)
*G01R 31/28* (2006.01)

(52) U.S. Cl.
CPC ..... *G01R 29/0878* (2013.01); *G01R 31/2889* (2013.01)

(58) Field of Classification Search
CPC ............ G01R 1/045; G01R 31/2889; G01R 29/0878; G01R 29/08; G01R 31/28; G01R 1/0483; G01R 1/0466; G01R 1/0433; G01R 31/2893; G01R 31/2886
See application file for complete search history.

(56) References Cited

U.S. PATENT DOCUMENTS

| 2008/0191949 A1* | 8/2008 | Rao ........................ G01R 29/10 343/703 |
| 2010/0220024 A1* | 9/2010 | Snow ....................... H01Q 9/28 343/772 |
| 2017/0227598 A1* | 8/2017 | Lam .................... G01R 31/2834 |

* cited by examiner

*Primary Examiner* — Jermele M Hollington
*Assistant Examiner* — Suresh K Rajaputra
(74) *Attorney, Agent, or Firm* — Viksnins Harris Padys Malen LLP

(57) ABSTRACT

A test socket assembly including a contactor body having a socket opening sized and configured to receive a device under test therein, and one or more waveguides at least partially disposed within the contactor body or external to the contactor body. The assembly further including at least one waveguide antenna probe coupled with the one or more waveguides, where the at least one waveguide antenna probe including a first set of sides and a second set of sides, at least one of the first set of sides are flared out away from the longitudinal axis.

20 Claims, 4 Drawing Sheets

TEST SOCKET ASSEMBLY WITH WAVEGUIDE ANTENNA PROBE

RELATED APPLICATION

This application claims priority to U.S. Provisional Application No. 62/802,883 that was filed on Feb. 8, 2019. The entire content of the application referenced above is hereby incorporated by reference herein.

TECHNICAL FIELD

Test contactor assemblies and related methods.

TECHNICAL BACKGROUND

Test contactors are used on printed circuit boards to test various parameters and/or components of semiconductor devices. Electronic devices have become smaller yet more powerful, resulting crowded and complex circuit boards. For example, modern automobiles are using RADAR equipment for collision avoidance, parking assist, automated driving, cruise control, etc. The radio frequencies used in such systems are typically 76-81 GHz (W-band). Also, the radio frequencies used for WiFi applications are in the range of 56-64 GHz. For 5G wireless communication, frequency bands 24-28 GHz as well as 37-43.5 GHz are recently licensed for high bandwidth and high-speed wireless communication transmission. Next generation IC's will push operating frequencies into these higher frequencies. Semiconductor devices that operate at these frequencies need to be tested, but existing test contactor technology cannot operate in the W-band due to extreme transmission line impedance mismatches, and high loss. Even well matched contactor technologies need traditional PCB transitions and RF connectors that create additional loss and inhibit mmWave signals from reaching the device under test (DUT).

Antennas currently used in in test applications have a narrow radiation beam width, are large in size, and cannot readily fit with existing semiconductor test equipment. What is needed is an antenna that has a high radiation beam width, a relatively smaller size, and a configuration that readily fits with current semiconductor test equipment. For these and other reasons there is a need for the subject matter of the present disclosure.

SUMMARY

In one or more embodiments, a test socket assembly including a contactor body having a socket opening sized and configured to receive a device under test therein, and one or more waveguides at least partially disposed within the contactor body or external to the contactor body. The assembly further including at least one wave guide antenna probe coupled with the one or more waveguides, where the at least one wave guide antenna probe including a first set of sides and a second set of sides, at least one of the first set of sides are flared out away from the longitudinal axis.

In one or more embodiments, at least one of the second set of sides are angled inward toward the longitudinal axis.

In one or more embodiments, the one or more waveguides is a rectangular waveguide defined in part by short sides and long sides.

In one or more embodiments, the at least one of the first set of sides are flared out along at least one of the long sides.

In one or more embodiments, the at least one of the second set of sides are angled inward along at least one of the short sides.

In one or more embodiments, the at least one waveguide antenna probe is coupled to the waveguide end.

In one or more embodiments, each of the second set of sides are angled inward toward the longitudinal axis.

In one or more embodiments, each of the first set of sides are flared out away from the longitudinal axis.

In one or more embodiments, the test socket assembly further includes a wave guide interconnect between the one or more waveguides and the at least one waveguide antenna probe.

In one or more embodiments, the first set of sides are disposed at an angle relative to the longitudinal axis, the angle is approximately 5-45 degrees.

In one or more embodiments, the second set of sides are disposed at an angle relative to the longitudinal axis, the angle is approximately 5-45 degrees.

In one or more embodiments, the test socket assembly further includes a first device under test disposed with the socket opening.

In one or more embodiments, a test socket assembly includes a contactor body, where the contactor body having a socket opening sized and configured to receive a device under test therein. The assembly further includes one or more waveguides at least partially disposed within the contactor body or external to the contactor body, where the one or more rectangular waveguides terminating at a waveguide end, and the one or more rectangular waveguides defined in part by a longitudinal axis. At least one wave guide antenna probe is coupled with the one or more rectangular waveguides. The wave guide antenna probe including a first set of sides and a second set of sides, where each of the first set of sides are flared out away from the longitudinal axis, each of the second set of sides are angled inward toward the longitudinal axis, and the first set of sides are disposed on opposite sides of the longitudinal axis, and the second set of sides are disposed on opposite sides of the longitudinal axis.

In one or more embodiments, the one or more waveguides is a rectangular waveguide defined in part by short sides and long sides.

In one or more embodiments, the at least one of the first set of sides are flared out along at least one of the long sides.

In one or more embodiments, the at least one of the second set of sides are angled inward along at least one of the short sides.

In one or more embodiments, the at least one waveguide antenna probe is coupled to the waveguide end.

In one or more embodiments, the test socket assembly further includes a waveguide interconnect between the one or more waveguides and the at least one waveguide antenna probe.

In one or more embodiments, the first set of sides are disposed at an angle relative to the longitudinal axis, the angle is approximately 5-45 degrees.

In one or more embodiments, the second set of sides are disposed at an angle relative to the longitudinal axis, the angle is approximately 5-45 degrees.

In one or more embodiments, the test socket assembly further includes a first device under test disposed with the socket opening.

In one or more embodiments, a test socket assembly includes a contactor body. The contactor body has a socket opening sized and configured to receive a device under test therein. The text socket further includes one or more waveguides at least partially disposed within the contactor body or external to the contactor body, and the one or more waveguides terminating at a waveguide end, the one or more waveguides defined in part by a longitudinal axis. The text socket assembly further includes at least one waveguide antenna probe coupled with the one or more waveguides, and the at least one waveguide antenna probe includes a first set of sides and a second set of sides, the first set of sides substantially parallel to the second set of sides, wherein the first set of sides are disposed on opposite sides of the longitudinal axis, and the second set of sides are disposed on opposite sides of the longitudinal axis.

In one or more embodiments, the test socket assembly further includes a waveguide interconnect between the one or more waveguides and the at least one waveguide antenna probe.

In one or more embodiments, a test socket assembly includes a contactor body, the contactor body has a socket opening sized and configured to receive a device under test therein. A printed circuit board includes one or more coplanar waveguides. The printed circuit board is at least partially disposed within the contactor body or external to the contactor body. At least one waveguide antenna probe is coupled with the one or more coplanar waveguides.

In some embodiments, at least one waveguide antenna probe includes a conical horn antenna.

In some embodiments, at least one waveguide antenna probe includes a rectangular horn antenna.

In some embodiments, the test socket assembly includes a radio frequency choke interposed between the coplanar waveguide and the one waveguide antenna probe.

In some embodiments, the test socket assembly further includes an input radio frequency choke coupled to the at least one or more coplanar waveguides.

These and other embodiments, aspects, advantages, and features of the present invention will be set forth in part in the description which follows, and will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DETAILED DESCRIPTION

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

A test socket assembly 100 includes one or more waveguides embedded therein, and a waveguide antenna probe. The waveguide antenna probe combines the high gain of a horn antenna with the wide beam width of a waveguide probe. Using a waveguide interconnect to the horn antenna probe offers the lowest loss transmission line and flexibility in integration into the test equipment. The waveguide interconnect also eliminates the transitions between differing electrical interconnects which causes additional loss and impedance discontinuities.

In one or more embodiments, the waveguide antenna probe is embedded within a semiconductor test socket assembly. It is designed for near or far field test of single polarized antennas (package, module, or die configurations). The probe can be used for low volume characterization and high volume production test of semiconductor devices in an automated test environment. The waveguide antenna probe offers large beam widths to cover wide areas of antenna arrays in close proximity to the waveguide aperture (for example 20 mm or less). The orientation of the waveguide antenna probe is defined in part by the arrangement of the antenna under test (AUT).

In one or more embodiments, the test socket assembly 100 communicates via the waveguide antenna probe and optionally via probes with the device under test 200 in a hybrid arrangement. The test socket assembly 100 allows direct communication between test hardware and the device under test while optionally maintaining a contacted spring probe interface for remaining standard inputs and outputs on a BGA/QFN/WLCSP, or any other packaging technology. The test socket assembly 100 can include probes and lead frames and other features as described in U.S. Pat. No. 10,037,933, which is incorporated herein by reference in its entirety.

Figure 1:
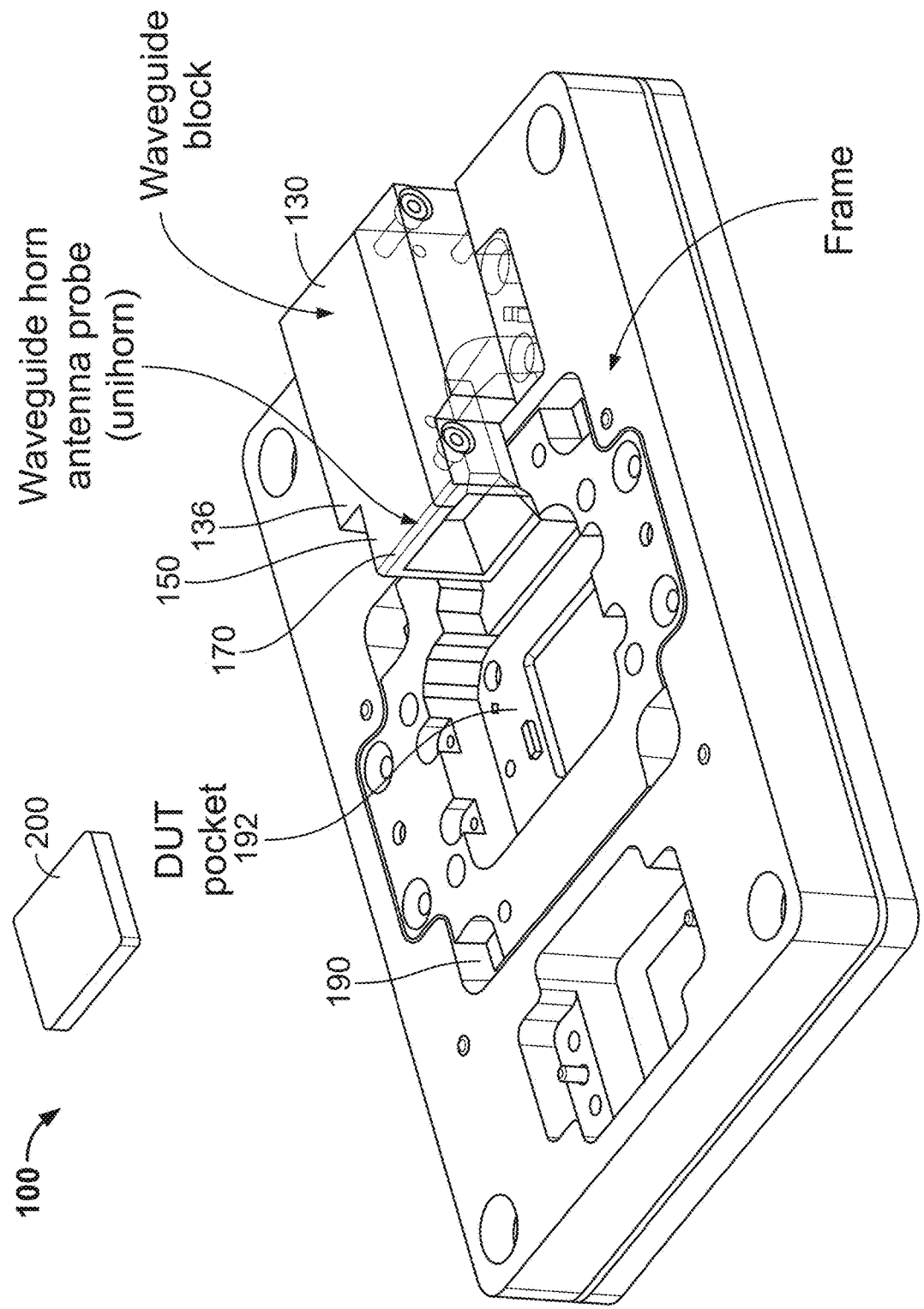
FIG. 1 illustrates a perspective view of a test socket assembly as constructed in one or more embodiments.
Figure 3:
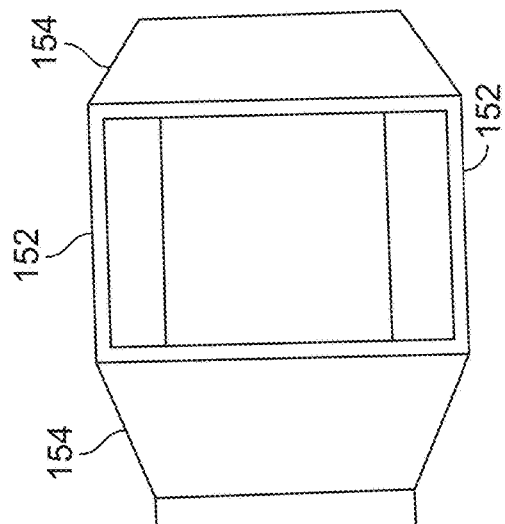
FIG. 3 illustrates a top view of a waveguide antenna probe as constructed in one or more embodiments.
Figure 4:
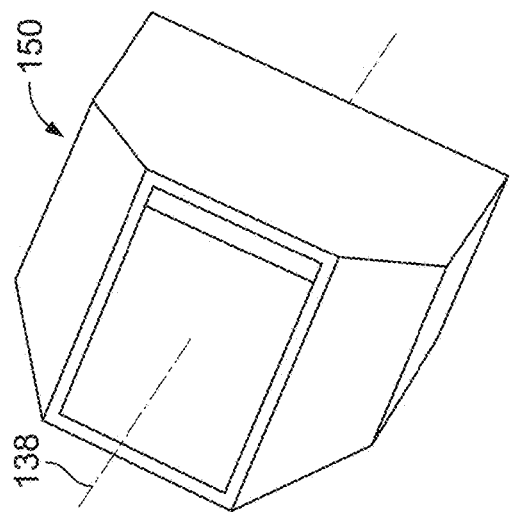
FIG. 4 illustrates a perspective view of a waveguide antenna probe as constructed in one or more embodiments.

FIG. 1 illustrates a test socket assembly 100 with a contactor on the side which receives the device under test (DUT). In one or more embodiments the test socket assembly 100 generally includes contactor body 190, a lead frame assembly, optional spring probes, a printed circuit board, a socket frame, a waveguide 130, and a waveguide antenna probe 150.

Figure 2:
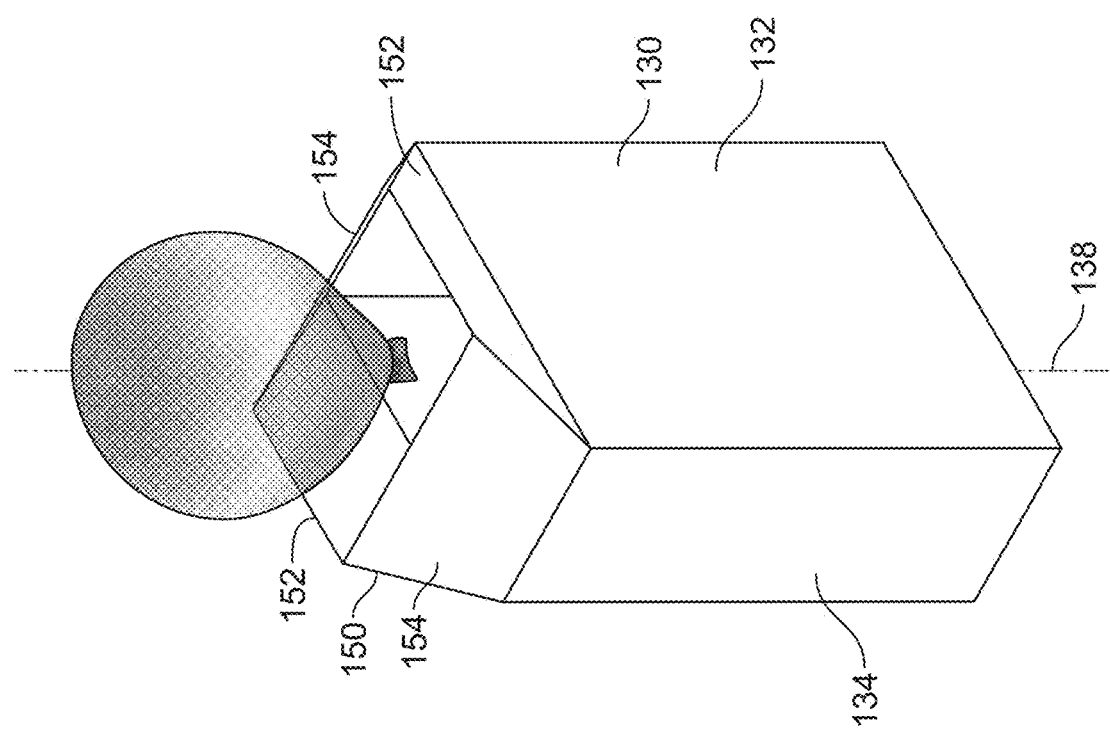
FIG. 2 illustrates a perspective view of a waveguide antenna probe as constructed in one or more embodiments.
Figure 6:
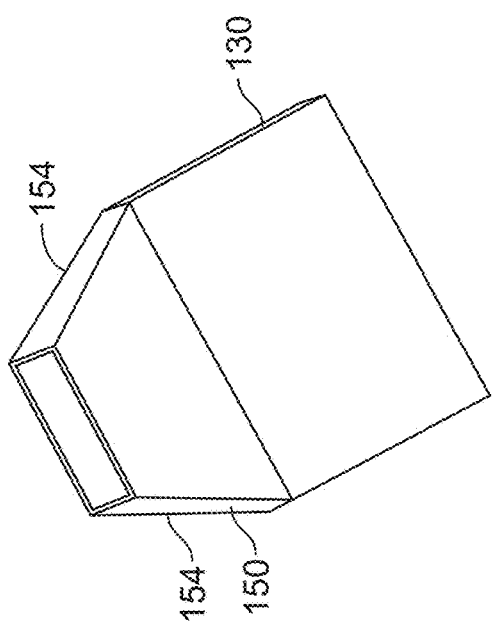
FIG. 6 illustrates a perspective view of a waveguide antenna probe as constructed in one or more embodiments.
Figure 5:
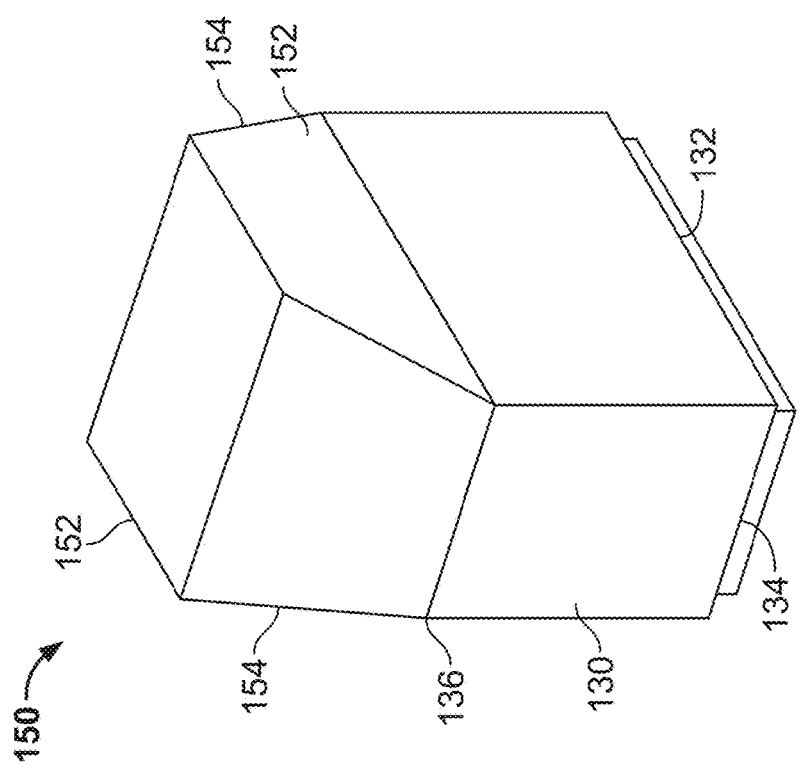
FIG. 5 illustrates a perspective view of a waveguide antenna probe as constructed in one or more embodiments.

The test socket assembly 100 is used with a device under test 200. Referring to FIG. 2, a socket opening 192 within the contactor body receives the device under test 200 therein and assists in aligning the device under test 200 with the test socket assembly 100. The socket opening 192 is sized and configured to receive the device under test 200 therein. The lead frame assembly communicates with the device under test via the DUT end of the lead frame assembly. The test socket assembly 100 communicates with the tester via a tester interface, such as the waveguide horn antenna probe.

The test socket assembly 100 includes a contactor body 190 and a lead frame assembly disposed within the contactor body 190. The lead frame assembly at least one transmission line within the lead frame assembly. The at least one transmission line is configured to communicate to the device under test, for example, when the device under test is disposed within the socket opening 192. In one or more embodiments, the at least one transmission line includes one or more waveguides 130.

The one or more waveguides 130 are at least partially disposed within the contactor body 190 or are external to the contactor body 190, and extend to a waveguide end 136. The one or more waveguides 130 are defined in part by a longitudinal axis 138. In one or more embodiments, the one or more waveguides is a rectangular waveguide defined in part by long sides 132 and short sides 134. The long sides 132 are longer in length than the short sides 134. In one or more embodiments, the waveguide has a square cross-sectional shape, where the sides each approximately have the same length.

The test socket assembly 100 further includes at least one waveguide antenna probe 150 coupled with the one or more waveguides 130, as shown in FIGS. 2-6. The waveguide antenna probe 150 is used to propagate the signal to the DUT 200. The at least one waveguide antenna probe 150 includes a first set of sides 152 and a second set of sides 154. The first set of sides 152 are two sides opposite from each other. The second set of sides 154 are two sides opposite from each other. At least one of the first set of sides 152 are flared out away from the longitudinal axis 138 of the waveguide antenna probe 150. In one or more embodiments, the first set of sides 152 are flared out with a gradual widening of the probe along an axis when viewed from the top. In one or more embodiments, and at least one of the second set of sides 154 are not flared out away from the longitudinal axis 138 of the one or more waveguides 130. In some embodiments, the first set of sides 152 are substantially parallel to the second set of sides 154. The first set of sides 152 are disposed on opposite sides of the longitudinal axis 138, and the second set of sides 154 are disposed on opposite sides of the longitudinal axis 138.

In one or more embodiments, at least one of the second set of sides 154 of the at least one waveguide antenna probe 150 is angled inward toward the longitudinal axis 138 of the one or more waveguides 130. In one or more embodiments, the at least one of the first set of sides 152 are flared out along at least one of the long sides 132 of the one or more waveguides 130. In one or more embodiments, the at least one of the second set of sides 154 are angled inward along at least one of the short sides 134 of the one or more waveguides 130. In one or more embodiments, each of the second set of sides 154 are angled inward toward the longitudinal axis 138 of the one or more waveguides 130. In one or more embodiments, each of the first set of sides 152 are flared out away from the longitudinal axis 138 of the one or more waveguides 130.

In one or more embodiments, the at least one waveguide antenna probe 150 is coupled to the waveguide end of the one or more waveguides 130. In one or more embodiments, the test socket assembly 100 further includes a waveguide interconnect 170 between the one or more waveguides 130 and the at least one waveguide antenna probe 150. The waveguide antenna probe 150 is made by machining the component or by 3D printing process. The waveguide and waveguide antenna probe can be machined on one side, and then put a cap on it. The 3D printing allows for a higher level of flexibility in routing and placement of the waveguide antenna probe due to the ability to bend in the E-field and H-field planes without impact to the cross-section of the horn antenna probe or waveguide. The waveguide antenna probe easily interfaces with standard or custom waveguide footprints on external test equipment.

In one or more embodiments, the first set of sides 152 are disposed at an angle relative to the longitudinal axis 138 of the one or more waveguides 130, where the angle is approximately 5-45 degrees. In one or more embodiments, the second set of sides 154 are disposed at an angle relative to the longitudinal axis 138 of the one or more waveguides 130, where the angle is approximately 5-45 degrees.

Figure 7:
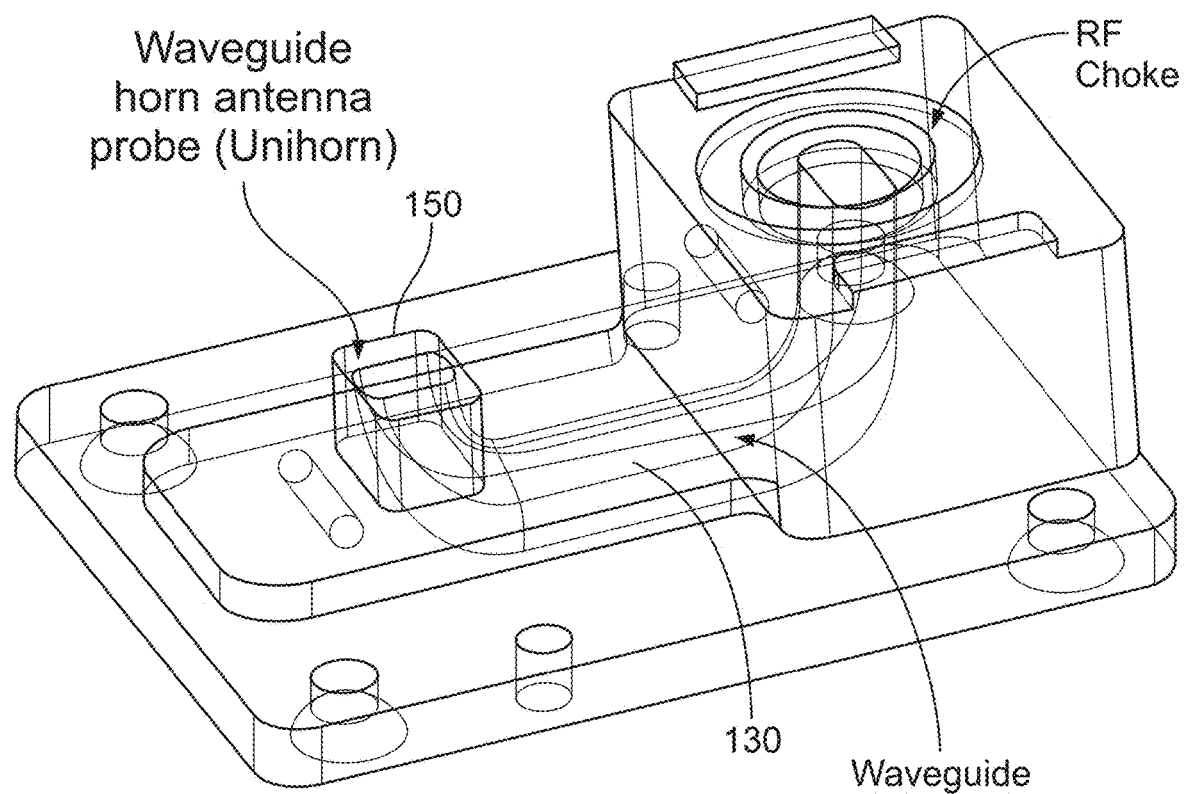
FIG. 7 illustrates a perspective view of a manual actuator loadplate assembly as constructed in one or more embodiments.

The waveguide horn antenna probe 150 can be used in a number of different configurations. For example, FIG. 7 illustrates the waveguide antenna probe 150 installed in a manual actuator loadplate assembly.

The following is a method for using the test socket assembly. In one or more embodiments, a method for testing components includes disposing a device under test in a test socket assembly, the test socket assembly a contactor body having a socket opening sized and configured to receive a device under test therein, and one or more waveguides at least partially disposed within the contactor body or external to the contactor body. The test socket assembly further including at least one waveguide antenna probe coupled with the one or more waveguides, where the at least one waveguide antenna probe including a first set of sides and a second set of sides, at least one of the first set of sides are flared out away from the longitudinal axis.

The method further includes connecting the device under test with the at least one transmission line, and sending signals to the device under test with the one or more waveguides and the waveguide antenna probe, and the device under test receives the signals. In one or more embodiments, the method further includes sending low speed signals to the device under test via one or more spring probes.

The test socket assembly described and shown herein is a test socket that is compatible with semiconductor back-end manufacturing, yet is capable in operating at the W-band frequencies. The waveguide antenna probe reduces the gain and achieves a small size with a wide beam width and a higher bandwidth. The antenna probe aperture can be modified to adjust the beam width. The bandwidth is defined by the waveguide standard chosen per application.

Figure 8:
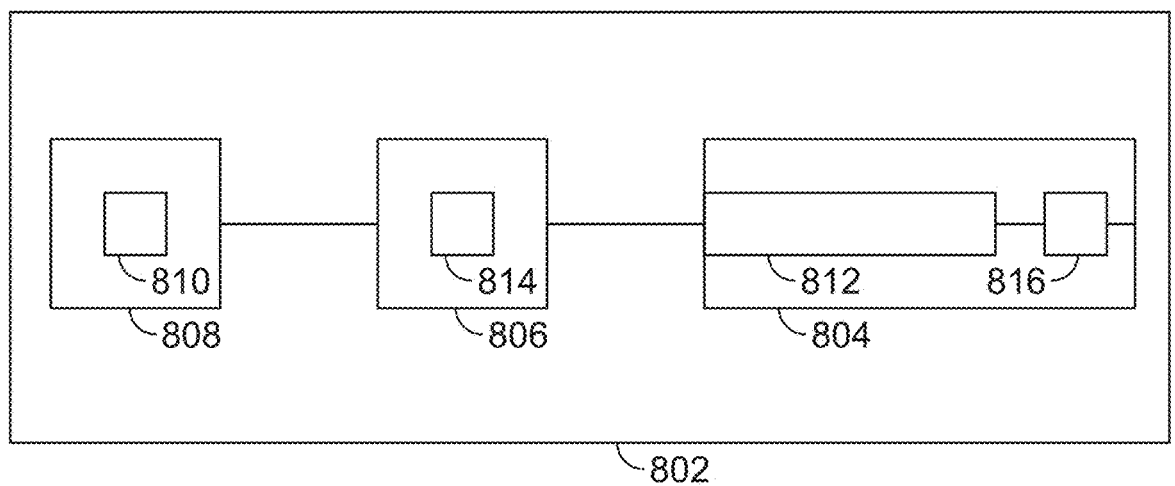
FIG. 8 shows a block diagram of a test socket assembly as constructed in one or more embodiments.

FIG. 8 shows a block diagram of a test socket assembly 800 including a contactor body 802, a printed circuit board 804, and a waveguide antenna probe 806 in accordance with some embodiments of the present disclosure. The contactor body 802 has a socket opening 808 sized and configured to receive a device under test 810 therein. The device under test 810 includes circuits and systems that require testing at microwave frequencies.

The printed circuit board 804 is at least partially disposed within the contactor body 802 or external to the contactor body 802. The printed circuit board 804 includes a coplanar waveguide 812. The coplanar waveguide 812 is not limited to a particular type of coplanar waveguide. Exemplary coplanar waveguides suitable for use in connection with the fabrication of the test socket assembly 800 include a standard coplanar waveguide and a grounded coplanar waveguide. A standard coplanar waveguide includes a coplanar waveguide formed from a conductor separated from a pair of ground planes, all formed on the same plane, above a dielectric medium. A grounded coplanar waveguide includes a ground plane provided on the opposite side of the dielectric from the conductor.

The waveguide antenna probe 806 is coupled with the coplanar waveguide 812. The waveguide antenna probe 806 is not limited to a particular type of waveguide antenna. In some embodiments, the waveguide antenna includes a horn antenna formed from a flaring metal waveguide shaped like a horn to direct radio waves in a beam. In some embodiments, the waveguide antenna probe 806 includes a conical horn antenna in which the horn antenna has a cross-sectional shape that is substantially circular. In some embodiments, the waveguide antenna probe 806 includes a rectangular horn antenna in which the horn antenna includes a cross-sectional shape that is substantially rectangular.

In some embodiments, the test socket assembly 800 includes a radio frequency choke 814 interposed between the coplanar waveguide 812 and the one waveguide antenna probe 806. In some embodiments, the test socket assembly 800 includes an input radio frequency choke 816 coupled to the coplanar waveguide 812. The input radio frequency choke 816 receives a test signal and delivers the test signal to the coplanar waveguide 812.

In operation, in some embodiments, a test signal travels along the coplanar waveguide 812 to the waveguide antenna probe 806 to be delivered to the device under test 810.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

What is claimed is:

1. A test socket assembly comprising:
a contactor body;
the contactor body having a socket opening sized and configured to receive a device under test therein;
one or more waveguides at least partially disposed within the contactor body or external to the contactor body, the one or more waveguides terminating at a waveguide end, the one or more waveguides defined in part by a longitudinal axis;
at least one waveguide antenna probe coupled with the one or more waveguides; and
the at least one waveguide antenna probe including a first set of sides and a second set of sides, at least one of the first set of sides are flared out away from the longitudinal axis, at least one of the second set of sides are not flared out away from the longitudinal axis, wherein the first set of sides are disposed on opposite sides of the longitudinal axis, and the second set of sides are disposed on opposite sides of the longitudinal axis.

2. The test socket assembly as recited in claim 1, wherein at least one of the second set of sides is angled inward toward the longitudinal axis.

3. The test socket assembly as recited in claim 1, wherein the one or more waveguides is a rectangular waveguide defined in part by short sides and long sides.

4. The test socket assembly as recited in claim 3, wherein the at least one of the first set of sides is flared out along at least one of the long sides.

5. The test socket assembly as recited in claim 4, wherein the at least one of the second set of sides is angled inward along at least one of the short sides.

6. The test socket assembly as recited in claim 1, wherein the at least one waveguide antenna probe is coupled to the waveguide end.

7. The test socket assembly as recited in claim 1, wherein each of the second set of sides are angled inward toward the longitudinal axis.

8. The test socket assembly as recited in claim 1, wherein each of the first set of sides are flared out away from the longitudinal axis.

9. The test socket assembly as recited in claim 1, further comprising a waveguide interconnect between the one or more waveguides and the at least one waveguide antenna probe.

10. The test socket assembly as recited in claim 1, wherein the first set of sides are disposed at an angle relative to the longitudinal axis, the angle is approximately 5-45 degrees.

11. A test socket assembly comprising:
a contactor body;
the contactor body having a socket opening sized and configured to receive a device under test therein;
one or more rectangular waveguides at least partially disposed within the contactor body or external to the contactor body, the one or more rectangular waveguides terminating at a waveguide end, the one or more rectangular waveguides defined in part by a longitudinal axis;
at least one waveguide antenna probe coupled with the one or more rectangular waveguides; and
the at least one waveguide antenna probe including a first set of sides and a second set of sides, each of the first set of sides are flared out away from the longitudinal axis, each of the second set of sides are angled inward toward the longitudinal axis, wherein the first set of sides are disposed on opposite sides of the longitudinal axis, and the second set of sides are disposed on opposite sides of the longitudinal axis.

12. The test socket assembly as recited in claim 11, wherein the one or more waveguides is a rectangular waveguide defined in part by short sides and long sides.

13. The test socket assembly as recited in claim 12, wherein the at least one of the first set of sides are flared out along at least one of the long sides.

14. The test socket assembly as recited in claim 13, wherein the at least one of the second set of sides are angled inward along at least one of the short sides.

15. The test socket assembly as recited in claim 11, wherein the at least one waveguide antenna probe is coupled to the waveguide end.

16. A test socket assembly comprising:
a contactor body;
the contactor body having a socket opening sized and configured to receive a device under test therein;
a printed circuit board including one or more coplanar waveguides, the printed circuit board at least partially disposed within the contactor body or external to the contactor body; and
at least one waveguide antenna probe coupled with the one or more coplanar waveguides.

17. The test socket assembly as recited in claim 16, wherein the at least one waveguide antenna probe includes a conical horn antenna.

18. The test socket assembly as recited in claim 16, wherein the at least one waveguide antenna probe includes a rectangular horn antenna.

19. The test socket assembly as recited in claim 16, further comprising a radio frequency choke interposed between the coplanar waveguide and the at least one waveguide antenna probe.

20. The test socket assembly as recited in claim 16, further comprising an input radio frequency choke coupled to the at least one or more coplanar waveguides.

\* \* \* \* \*